US008847076B2

(12) United States Patent
Sun

(10) Patent No.: US 8,847,076 B2
(45) Date of Patent: Sep. 30, 2014

(54) ATTACHMENT MECHANISM FOR ELECTRONIC COMPONENT

(75) Inventor: Zheng-Heng Sun, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 205 days.

(21) Appl. No.: 13/456,246

(22) Filed: Apr. 26, 2012

(65) Prior Publication Data

US 2013/0170161 A1 Jul. 4, 2013

(30) Foreign Application Priority Data

Dec. 30, 2011 (CN) .......................... 2011 1 0453302

(51) Int. Cl.
*H05K 7/12* (2006.01)
*H05K 7/14* (2006.01)

(52) U.S. Cl.
USPC ................... 174/138 G; 174/138 E; 439/328; 439/64; 439/358; 361/759; 361/807; 361/804

(58) Field of Classification Search
USPC ........... 174/138 E, 138 G; 439/326–328, 624, 439/625, 64, 331, 65, 74, 358; 361/748, 361/760, 769, 784, 785, 807, 810, 752, 759, 361/801, 794, 753, 804
See application file for complete search history.

(56) References Cited

U.S. PATENT DOCUMENTS 5,268,820 A * 12/1993 Tseng et al. .................. 361/785
5,422,790 A * 6/1995 Chen ............................ 361/785
6,089,876 A * 7/2000 Kuwahara et al. .............. 439/74
6,971,899 B1 * 12/2005 Liu ............................... 439/326
7,004,764 B2 * 2/2006 Boudreau et al. ......... 174/138 G
7,134,896 B1 * 11/2006 Chen ............................ 439/326
7,220,142 B2 * 5/2007 Liang ........................... 439/326
7,294,009 B1 * 11/2007 Peng et al. .................... 439/326
7,692,933 B1 * 4/2010 Mueller et al. ............ 174/138 E
8,500,457 B2 * 8/2013 Sun ................................ 439/65
8,512,063 B2 * 8/2013 Fu et al. ........................ 439/358

* cited by examiner

*Primary Examiner* — Angel R Estrada
(74) *Attorney, Agent, or Firm* — Novak Druce Connolly Bove + Quigg LLP

(57) ABSTRACT

An attachment mechanism for an electronic component includes a circuit board and a fastener. A first connector is fastened to the circuit board to be connected to a second connector of the electronic component. The first connector includes a mounting portion fastened to the circuit board and a large main body on a top of the mounting portion to connect to the second connector. A fastener includes a top wall, two engaging portions engaging with opposite sides of the electronic component, and two cantilevers slantingly extending toward each other from bottoms of the corresponding engaging walls. Two claws extend from each cantilever to engage with a corresponding end of the mounting portion and abut against a bottom surface of the main body.

16 Claims, 4 Drawing Sheets

ATTACHMENT MECHANISM FOR ELECTRONIC COMPONENT

CROSS-REFERENCE TO RELATED APPLICATIONS

Relevant subject matter is disclosed in six pending U.S. patent applications, all titled "ATTACHMENT MECHANISM FOR ELECTRONIC COMPONENT", respectively filed on Mar. 20, 2012, with the application Ser. Number 13/424,390, on Mar. 22, 2012, with the application Ser. No. 13/426,629, on Mar. 23, 2012, with the application Ser. No. 13/427,923, on Mar. 29, 2012, with the application Ser. No. 13/434,791, on Apr. 12, 2012, with the application Ser. No. 13/444,874, and on Apr. 13, 2012, with the application Ser. No. 13/445,935, which are assigned to the same assignee as this patent application.

BACKGROUND

1. Technical Field

The present disclosure relates to a mechanism for attaching an electronic component to a device.

2. Description of Related Art

Certain components in a server, such as expansion cards, need to be attached to the motherboard of the server. Taking such an expansion card for example, an end of the expansion card is fastened to the motherboard, and a connector at an opposite end of the expansion card is connected to a connector of the motherboard. However, the connection of the connectors may not be solid enough and the expansion card may disengage from the connector of the motherboard, which adversely influences the data transmission of the server.

BRIEF DESCRIPTION OF THE DRAWINGS

Many aspects of the present embodiments can be better understood with reference to the drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
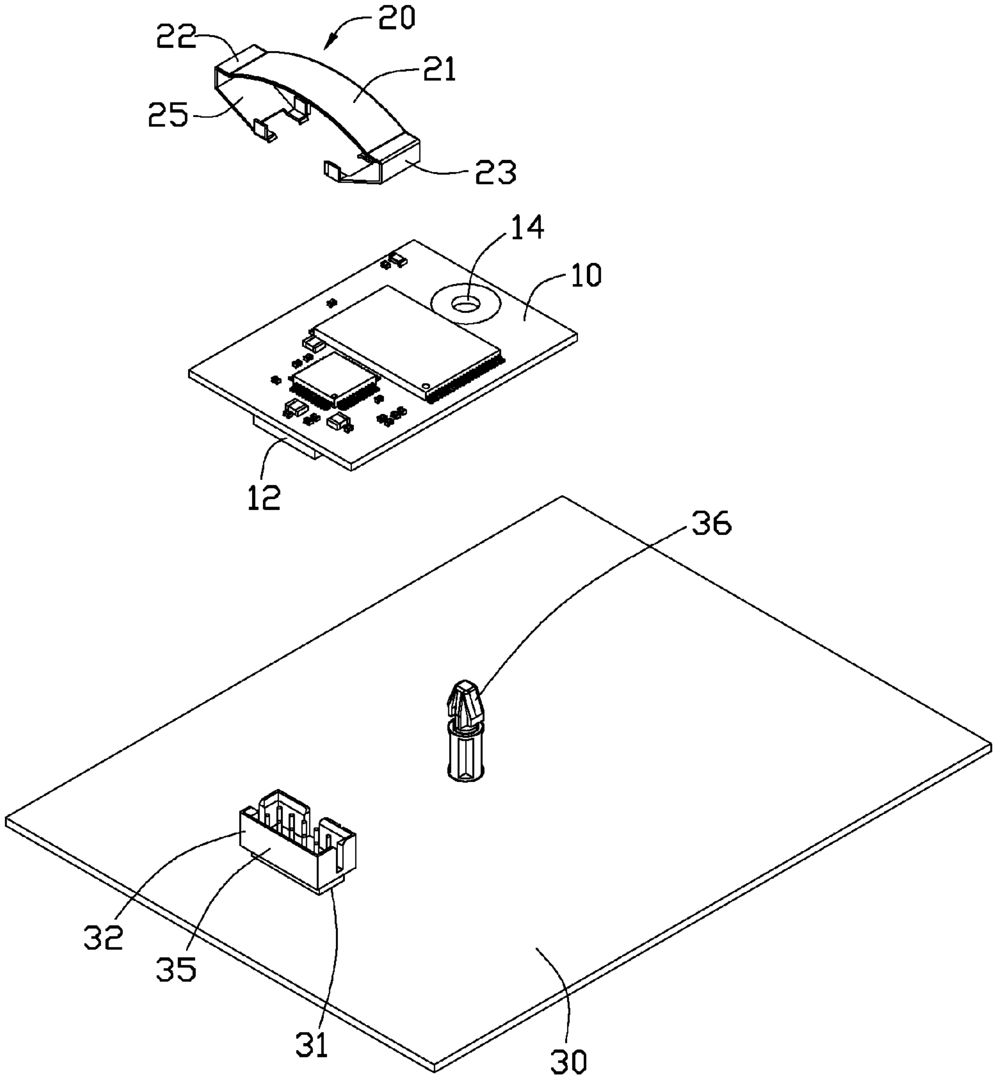
FIG. 1 is an exploded, isometric view of an exemplary embodiment of an attachment mechanism, together with an electronic component, wherein the attachment mechanism includes a fastener.

FIG. 1 shows an exemplary embodiment of an attachment mechanism for fastening an electronic component 10. The attachment mechanism includes a circuit board 30 and a fastener 20. The electronic component 10 includes a first connector 12 mounted to a first end of a bottom surface of the electronic component 10, and defines a through hole 14 in a second end of the electronic component 10 opposite to the first end.

A second connector 32 is fastened to the circuit board 30. The second connector 32 includes a small mounting portion 31 fastened to the circuit board 30 and a large main body 35 on a top of the mounting portion 31. A hook 36 extends up from the circuit board 30.

Figure 2:
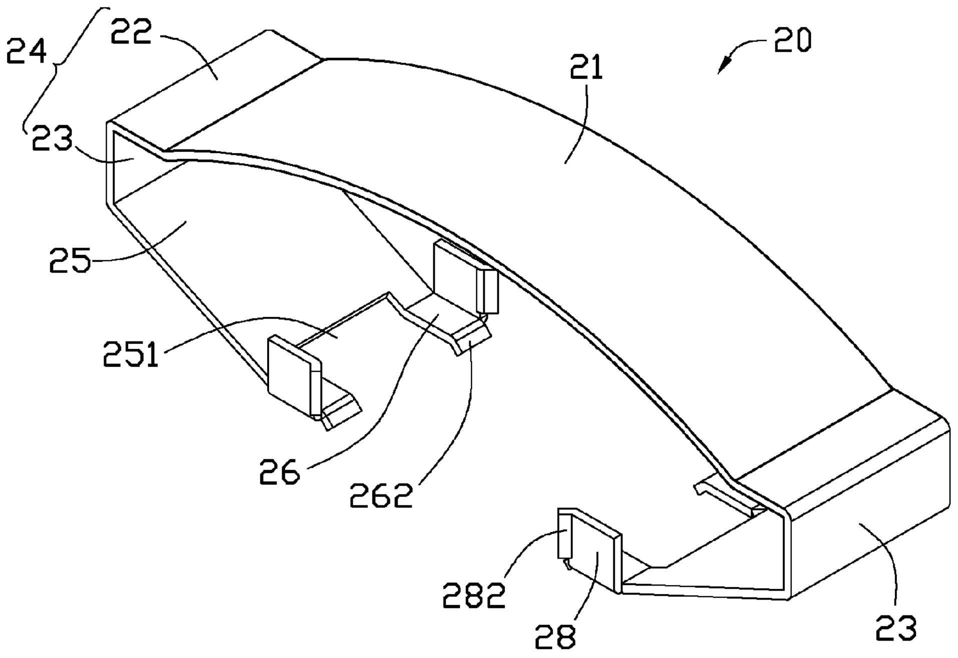
FIG. 2 is an enlarged view of the fastener of FIG. 1.

FIG. 2 shows the fastener 20 including a top wall 21 and two L-shaped engaging portions 24 extending from opposite ends of the top wall 21. The top wall 21 is arced up to form a bridge-shape. Each engaging portion 24 includes an abutting wall 22 extending from the corresponding end of the top wall 21, and a connection wall 23 perpendicularly extending down from a side of the abutting wall 22 away from the top wall 21. Two cantilevers 25 slantingly extend down from bottoms of the corresponding connection walls 23 toward each other. Two claws 26 extend from opposite ends of a bottom of each cantilever 25. Each cantilever 25 and the corresponding claws 26 bound a receiving space 251. A stop tab 28 extends up from an outer side of each claw 26. A guiding tab 262 slantingly extends down from a distal end of each claw 26. A guiding tab 282 slantingly extends outward from an end of each stop tab 28 away from the corresponding cantilever 25.

Figure 3:
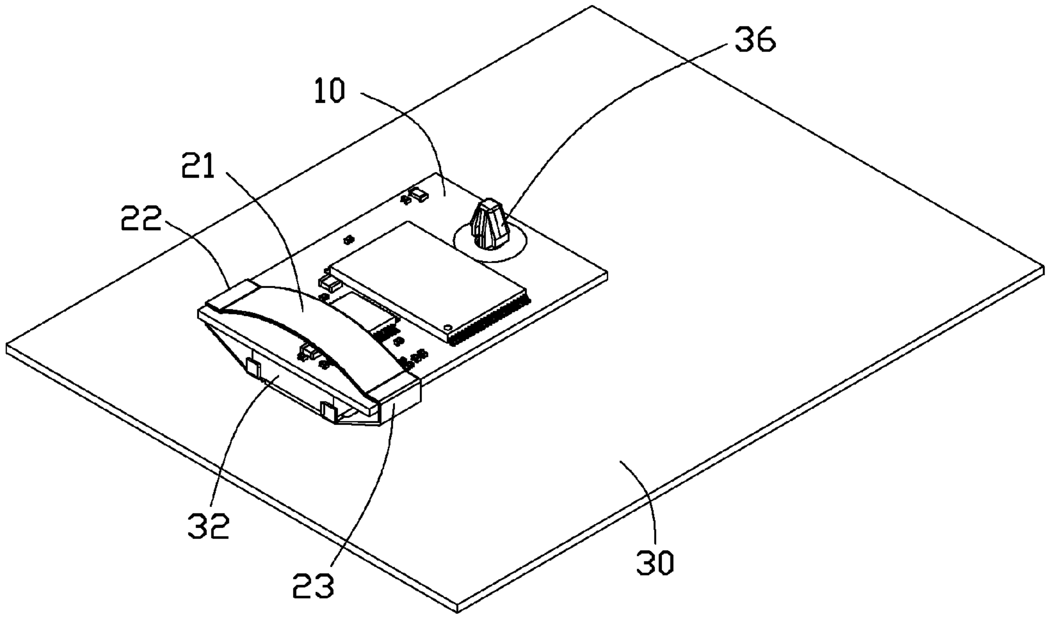
FIG. 3 is an assembled, isometric view of FIG. 1.
Figure 4:
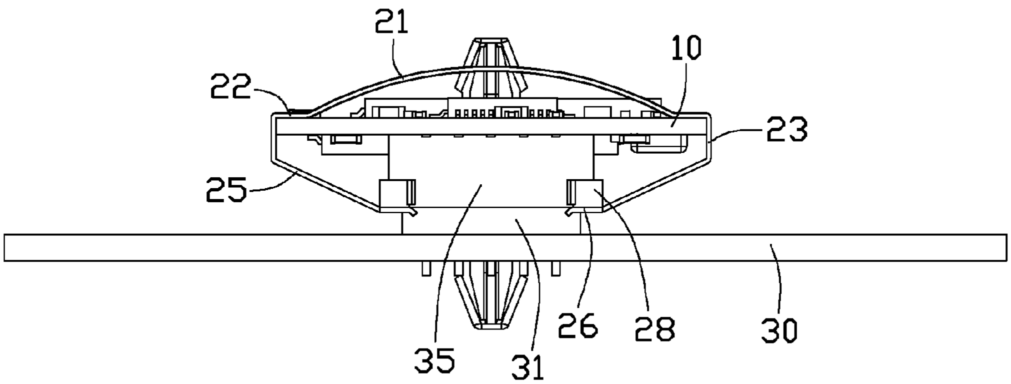
FIG. 4 is a front plan view of FIG. 3.

FIGS. 3 and 4 show in assembly, the first connector 12 is connected to the second connector 32. The hook 36 extends through the through hole 14, to fasten the second end of the electronic component 10. The fastener 20 is placed in front of the second connector 32, the connection walls 23 are manipulated away from each other and then the fastener 20 is moved toward the second connector 32. When the receiving spaces 251 align with the opposite ends of the second connector 32, the connection walls 23 are released. The claws 26 abut against the corresponding ends of a bottom surface of the main body 35 guided by the guiding tabs 262 so that the opposite ends of the mounting portions 31 are received in the corresponding receiving spaces 251. The stop tabs 28 abut against the corresponding side of the main body 35 guided by the guiding tabs 282. The abutting walls 22 abut against a top surface of the electronic component 10. The connection walls 23 abut against opposite sides of the electronic component 10. Thereby, the electronic component 10 is fastened to the circuit board 30.

In other embodiments, the stop tabs 28 and the guiding tabs 282 may be omitted.

It is believed that the present embodiments and their advantages will be understood from the foregoing description, and various changes may be made thereto without departing from the spirit and scope of the description or sacrificing all of their materials advantages, the examples hereinbefore described merely being exemplary embodiments.

What is claimed is:

1. An attachment mechanism for fastening an electronic component, comprising:

a circuit board;

a first connector fastened to the circuit board to be connected to a second connector of the electronic component, the first connector comprising a mounting portion fastened to the circuit board, and a large main body on a top of the mounting portion to connect to the second connector; and a fastener comprising a top wall, two engaging portions for engaging with opposite sides of a first end of the electronic component, two cantilevers slantingly extending toward each other from bottoms of the corresponding engaging portions, and two claws extending from each cantilever to engage with a corresponding end of the mounting portion and abut against a bottom surface of the main body.

2. The attachment mechanism of claim 1, wherein the top wall is arced up to form a bridge-shape.

3. The attachment mechanism of claim 1, wherein each engaging portion comprises a abutting wall extending from a corresponding end of the top wall to abut against a top surface of the electronic component, and a connection wall extending down from the abutting wall to abut against a corresponding side of the electronic component.

4. The attachment mechanism of claim 1, wherein each cantilever and the corresponding claws bound a receiving space, the opposite ends of the mounting portion are received in the corresponding receiving spaces.

5. The attachment mechanism of claim 1, wherein a guiding tab slantingly extends down from a distal end of each claw.

6. The attachment mechanism of claim 1, wherein a stop tab extends up from an outer side of each claw.

7. The attachment mechanism of claim 6, wherein a guiding tab slantingly extends outward from an end of each stop tab away from the corresponding cantilever.

8. The attachment mechanism of claim 1, wherein a through hole is defined in a second end of the electronic component, a hook extends up from the circuit board to engage in the through hole.

9. A circuit board assembly, comprising:

a circuit board, a first connector comprising a mounting portion fastened to the circuit board and a large main body on a top of the mounting portion;

an electronic component comprising a second connector to be connected to the main body of the first connector; and a fastener comprising a top wall, two engaging portions for engaging with opposite sides of a first end of the electronic component, two cantilevers slantingly extending toward each other from bottoms of the corresponding engaging portions, and two claws extending from each cantilever to engage with a corresponding end of the mounting portion and abut against a bottom surface of the main body.

10. The circuit board assembly of claim 9, wherein the top wall is arced up to form a bridge-shape.

11. The circuit board assembly of claim 9, wherein each engaging portion comprises a abutting wall extending from a corresponding end of the top wall to abut against a top surface of the electronic component, and a connection wall extending down from the abutting wall to abut against a corresponding side of the electronic component.

12. The circuit board assembly of claim 9, wherein each cantilever and the corresponding claws bound a receiving space, the opposite ends of the mounting portion are received in the corresponding receiving spaces.

13. The circuit board assembly of claim 9, wherein a guiding tab slantingly extends down from a distal end of each claw.

14. The circuit board assembly of claim 9, wherein a stop tab extends up from an outer side of each claw.

15. The circuit board assembly of claim 14, wherein a guiding tab slantingly extends outward from an end of each stop tab away from the corresponding cantilever.

16. The circuit board assembly of claim 9, wherein a through hole is defined in a second end of the electronic component, a hook extends up from the circuit board to engage in the through hole.

* * * * *